(12) United States Patent
Corbishley

(10) Patent No.: US 10,177,725 B2
(45) Date of Patent: Jan. 8, 2019

(54) DIFFERENTIAL AMPLIFIERS

(71) Applicant: NORDIC SEMICONDUCTOR ASA, Trondheim (NO)

(72) Inventor: Phil Corbishley, Trondheim (NO)

(73) Assignee: NORDIC SEMICONDUCTOR ASA, Trondheim (NO)

( * ) Notice: Subject to any disclaimer, the term of this patent is extended or adjusted under 35 U.S.C. 154(b) by 0 days.

(21) Appl. No.: 15/536,242

(22) PCT Filed: Dec. 14, 2015

(86) PCT No.: PCT/GB2015/053947
§ 371 (c)(1),
(2) Date: Jun. 15, 2017

(87) PCT Pub. No.: WO2016/097703
PCT Pub. Date: Jun. 23, 2016

(65) Prior Publication Data
US 2017/0353165 A1 Dec. 7, 2017

(30) Foreign Application Priority Data
Dec. 15, 2014 (GB) .................................. 1422309.3

(51) Int. Cl.
*H03F 3/45* (2006.01)

(52) U.S. Cl.
CPC ..... *H03F 3/45632* (2013.01); *H03F 3/45188* (2013.01); *H03F 3/45941* (2013.01); *H03F 2200/18* (2013.01); *H03F 2200/24* (2013.01); *H03F 2200/453* (2013.01); *H03F 2200/456* (2013.01); *H03F 2200/555* (2013.01); *H03F 2200/75* (2013.01); *H03F 2203/45036* (2013.01); *H03F 2203/45072* (2013.01); *H03F 2203/45074* (2013.01); *H03F 2203/45088* (2013.01); *H03F 2203/45101* (2013.01); *H03F 2203/45134* (2013.01); *H03F 2203/45136* (2013.01); *H03F 2203/45174* (2013.01); *H03F 2203/45202* (2013.01);
(Continued)

(58) Field of Classification Search
CPC .................................... H03F 3/04; H03F 3/45
USPC ........................................ 330/258, 259, 261
See application file for complete search history.

(56) References Cited

U.S. PATENT DOCUMENTS 6,081,162 A 6/2000 Johnson
6,621,343 B2 9/2003 Hart
(Continued)

OTHER PUBLICATIONS

Search Report for Application No. GB 1422309.3, dated May 29, 2015 (4 pages).
(Continued)

*Primary Examiner* — Steven J Mottola
(74) *Attorney, Agent, or Firm* — Womble Bond Dickinson (US) LLP; John J. Penny, Jr.

(57) ABSTRACT

A differential amplifier comprises:
a long tailed pair transistor configuration comprising a differential pair of transistors and a tail transistor; and
a replica circuit configured to vary a feedback current in the replica circuit to match a replica voltage to a reference voltage, wherein varying the feedback current in the replica circuit provides a bias voltage to the tail transistor in the long tailed pair which controls a tail current through the tail transistor to determine a common mode voltage in the long tailed pair.

14 Claims, 1 Drawing Sheet

(52) U.S. Cl.
CPC ............ *H03F 2203/45208* (2013.01); *H03F 2203/45244* (2013.01); *H03F 2203/45424* (2013.01); *H03F 2203/45434* (2013.01); *H03F 2203/45702* (2013.01)

(56) References Cited

U.S. PATENT DOCUMENTS

| | | |
|---|---|---|
| 6,977,526 B2 | 12/2005 | Li |
| 7,898,332 B2 * | 3/2011 | Deguchi .............. H03F 1/30 330/259 |
| 8,274,331 B2 | 9/2012 | Chuang |
| 2012/0194273 A1 | 8/2012 | Chuang |

OTHER PUBLICATIONS

International Search Report and Written Opinion for Application No. PCT/GB2015/053947, dated Mar. 3, 2016 (13 pages).

Maneatis, J. G. "Low-Jitter Process-Independent DLL and PLL Based on Self-Biased Techniques," IEEE Journal of Solid-State Circuits, IEEE Service Center, Piscataway, NJ, USA, v. 31, No. 11, Nov. 1, 1996.

* cited by examiner

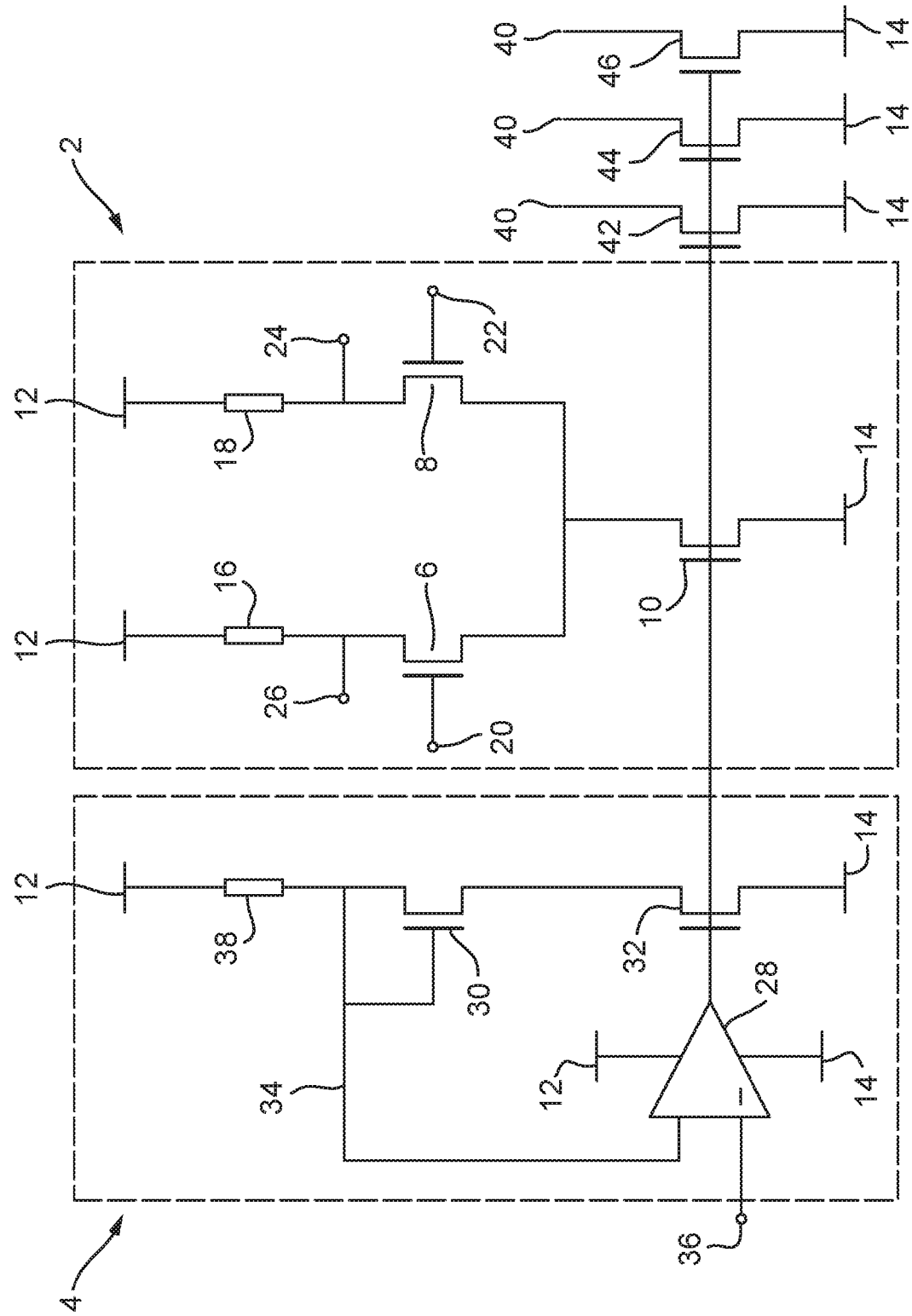

DIFFERENTIAL AMPLIFIERS

This application claims priority under 35 U.S.C. § 119 to Great Britain Patent Application No. 1422309.3 filed on Dec. 15, 2014, and under 35 U.S.C. §365 to PCT/GB2015/053947 filed on Dec. 14, 2015. The entire disclosures of which are expressly incorporated by reference herein.

This invention relates to differential amplifiers and particularly to the control of a common mode voltage on a differential amplifier.

Differential amplifiers amplify the difference between two input signals and produce as an output an amplified differential signal. Conventionally however, these devices are non-ideal in practice and tend to superimpose a common mode signal onto the differential output for example. A common mode signal is a signal that is present on both inputs, which tends to obscure the differential signal of interest. Common mode signals often arise from radiation coupled to both inputs. Common mode signals can also arise due to differences between the resistances of resistors of the same nominal value due to the inherent manufacturing tolerances associated therewith, or from a tail transistor in a long tailed pair configuration possessing finite (and temperature dependent) resistance. Another source of common mode signals is fluctuations on the supply voltage. It is often an objective when designing differential amplifiers to reduce the presence of this common mode output signal as much as possible.

In conventional differential amplifiers, it is known per se to utilise a technique called common-mode feedback (CMFB) wherein a feedback loop is used to adjust the input to the differential amplifier to compensate for a sensed common mode voltage. An example of this technique is given in "Analysis and Design of Analog Integrated Circuits, 5th Edition", Gray, Hurst, Lewis and Meyer, 2009 Wiley & Sons.

However, such amplifiers are often difficult to stabilise, requiring compensation capacitors and resistors connected across the output terminals to measure common mode output, and as such the bandwidth suffers and undesirable instabilities can arise at particular frequencies. Feedback loops also tend to require considerable power and as such are not well suited to low power applications such as battery powered portable devices. Such amplifiers also suffer from long start up times and long recovery periods following saturation of the amplifier.

The present invention sets out to provide an alternative approach.

From a first aspect, the invention provides a differential amplifier comprising:
 a long tailed pair transistor configuration comprising a differential pair of transistors and a tail transistor; and
 a replica circuit configured to vary a feedback current in the replica circuit to match a replica voltage to a reference voltage, wherein varying the feedback current in the replica circuit provides a bias voltage to the tail transistor in the long tailed pair which controls a tail current through the tail transistor to determine a common mode voltage in the long tailed pair.

Thus it will be seen by those skilled in the art that, in accordance with the invention, a replica circuit models the state of a long tailed pair at a given moment in time and provides feedforward control to set the common mode voltage of the long tailed pair to a particular value. This advantageously allows the replica circuit to compensate for local parameter variations, such as fluctuations in temperature, as well as process variation associated with the fabrication of devices. This also advantageously removes the instability issues associated with implementing feedback circuits, which require effort to mitigate when designing such a circuit.

It will be appreciated by a person skilled in the art that the tail transistor behaves as a current source, and is usually disposed between the differential pair of transistors and a power supply rail or commonly ground. However this is not essential and other topologies are envisaged, for example a cascade transistor configuration could be located between the differential pair and a tail transistor which would lead to increased performance by increasing the output resistance of the current source when compared to a single tail transistor configuration.

It will also be appreciated by a person skilled in the art that the replica circuit preferably comprises components arranged in a similar (but not necessarily identical) way to those in the circuit of which it is designed to replicate.

It is often the case that power considerations are a priority in modern circuit design. Conventional differential amplifiers that use feedback to control the common mode voltage present on the output of the differential amplifier consume more power than is desirable for low power applications such as battery powered devices. The use of a feedforward control provided in accordance with the present invention advantageously reduces the power required by a differential amplifier whilst giving sufficient control of common mode voltages.

There are a number of ways of configuring a differential amplifier. In one example a single-ended output is provided wherein the output is an amplified version of the difference between two input signals and is relative to a predetermined value, often ground; this is known in the art as a single-ended amplifier. However, it is often desirable to configure the differential amplifier such that the output is an amplified version of the difference between two input signals but the output floats around a value that is not predetermined; this is known in the art as a fully differential amplifier. Fully differential amplifiers are often useful as they permit the double-ended output of the amplifier to then be used as a double-ended input to a subsequent differential pair. In other words, they facilitate cascading. Fully differential amplifiers also provide twice the gain of a single-ended amplifier without the requirement for additional circuitry such as a current mirror as would be needed to provide a similar gain in the case of the latter. In some sets of embodiments, the differential amplifier is configured as a fully differential amplifier.

As stated above, it may be desirable for a particular amplifier circuit to comprise more than one differential pair stage. In accordance with the present invention, it is possible for the feedforward control to be applied to more than one differential pair, removing the need for each differential pair to be provided with its own feedback control to maintain a particular common mode output. Using the same feedforward control for multiple differential pairs advantageously permits the implementation of multi-stage amplifiers with fewer components and lower power requirements than would be the case with conventional differential amplifier designs. In some sets of embodiments, the replica circuit controls the common mode voltage in the differential pair and at least one additional differential pair. The differential pairs are conveniently similar (e.g. all comprising long tailed pairs) or identical but may be different.

The replica circuit may be used to provide constant control of the common mode voltage present on the output of the differential amplifier. The replica circuit provides a replica of the common mode voltage present on the output of the differential amplifier and adjusts the feedback current in an internal feedback loop to drive the replica voltage to a desired reference voltage.

In order to control the common mode voltage present on the output of the differential amplifier without the use of feedback, it is desirable to have a local replica of the common mode voltage. In order for the replica voltage to reflect the current state of the common mode voltage, it is advantageous to have the replica circuit reflect the topology of the differential amplifier, yet it is not necessary to have the replica circuit comprise an entire differential pair, as only one side of the differential pair is required to model the common mode voltage. In some sets of embodiments, the replica circuit includes a feedback loop comprising half a differential pair. In some sets of embodiments, the feedback loop further comprises an amplifier.

The differential pair transistors may be connected to a power supply voltage via a load. In conventional differential amplifier configurations, the aforementioned loads are typically active loads comprising transistors. However, the Applicant has appreciated that there may, in some circumstances, be advantages in replacing such transistors with resistors. This would not be typical in an amplifier configuration, as the resistors reduce the gain and drive strength. In the context of using the circuit in a filter application however, high gain is not essential, and the fixed resistors provide a linear relationship between the tail current controlled by the replica circuit and the common mode voltage present on the output of the differential amplifier. In some sets of embodiments therefore, at least one of the differential pair of transistors is connected to a power supply voltage via a resistor.

It will be appreciated by a person skilled in the art that a substantial reduction in power requirements is obtained because a single replica circuit can drive multiple differential pairs, rather than each differential pair requiring its own feedback circuit. The skilled person will also appreciate that producing a replica voltage external to the differential pair allows for the same voltage to be obtained using lower power components than would be necessary in conventional differential amplifier circuits.

This is because any components such as resistors or transistors that are part of the replica circuit can all be scaled such that the power consumption of the replica circuit is reduced while the effect of the circuit remains the same. While the replica circuit may require more power than a conventional feedback loop due to the amplifier, the skilled person will appreciate that driving multiple differential pairs with the same replica circuit can negate this increase in power requirements. In some sets of embodiments, the replica circuit is scaled to use less current than the long tailed pair current. In some further sets of embodiments, the replica circuit is scaled to use less than 50% of the long tailed pair current.

There are a number of different transistor technologies that are available for the fabrication of semiconductor devices. However, for low power applications, field effect transistors (FETs) are the most suitable technology due to their low current operating requirements. In some sets of embodiments, the differential amplifier comprises field effect transistors.

From a second aspect, the invention provides a batter powered integrated circuit comprising a differential amplifier as described above.

An embodiment of the present invention will now be described, by way of example only, with reference to the accompanying drawings, in which:

FIG. 1 is a circuit diagram of an exemplary embodiment of the present invention.

FIG. 1 shows a circuit diagram of an exemplary embodiment of the present invention. A differential amplifier comprises a long tailed pair 2 and a replica circuit 4. The replica circuit 4 provides an output that is connected to the tail transistor 10 of the long tailed pair 2, as will be described in further detail below.

The long tailed pair 2 comprises a differential pair of N-channel field effect transistors 6, 8 that are arranged such that their sources are connected to one another and subsequently to ground 14 via a tail transistor 10. The drain of each respective transistor is then connected to a positive power supply 12 via respective resistors 16, 18. The gates of each of the N-channel FETs 6, 8 are then connected to the positive signal input 20 and negative signal input 22 respectively. This differential input drives the long tailed pair in a manner known per se to those skilled in the art.

The replica circuit 4 comprises a high gain amplifier 28 arranged with a feedback loop that resembles one half of a long tailed pair, containing a transistor 30 that performs in a similar manner to the differential pair transistors 6, 8. The high gain amplifier 28 is connected to the positive power supply 12 and ground 14, and is provided with a reference voltage 36 on its negative input. This reference voltage 36 is the voltage to which the common mode voltage of the long tailed pair 2 will be driven.

The output of the high gain amplifier 28 drives a replica tail transistor 32 within the feedback loop, as well as the tail transistor 10 of the long tailed pair 2 as will be described further below. The replica tail transistor 32 varies the amount of current flowing around the feedback loop, which due to the resistor 38, varies a replica voltage 34. The high gain amplifier 28 amplifies the difference between replica voltage 34 and reference voltage 36, so any difference between them will cause the replica tail transistor 32 to act such as to oppose any difference between the voltages, driving the replica voltage 34 to match the reference voltage 36.

The output from the high gain amplifier 28 is also connected to the tail transistor 10 as mentioned above. This ensures that operations performed on the replica tail transistor 32 are reflected as similar operations performed on the tail transistor 10, thus controlling the current flowing through the long tailed pair 2. Due to the fixed resistors 16, 18, this controlled current is analogous to controlling the common mode voltage present on the output 24, 26 of the long tailed pair 2, and the common mode voltage is driven to match the replica voltage 34 and reference voltage 36.

The transistors 30, 32 and resistor 38 within the replica circuit 4 are scaled down to use ¼ of the long tailed pair current. This reduces the power consumption of the replica circuit 4 while maintaining the ability to control the common mode voltage in the long tailed pair 2.

Additional differential pairs 40 can be driven by the same replica circuit 4 by connecting them to additional tail transistors 42, 44, 46. The output of the high gain amplifier 28 is connected to the gates of further tail transistors 42, 44, 46, providing the same common mode voltage at their respective outputs as provided to the output of long tailed pair 2.

Thus it will be seen that a differential amplifier with feedforward common mode signal control has been described. Although a particular embodiment has been described in detail, many variations and modifications are possible within the scope of the invention.

The replica circuit provides a real time model of the common mode voltage present on the output of the long tailed pair(s). The high gain amplifier within the feedback loop compares the replica of the common mode voltage to the reference voltage and alters its output voltage to drive the former toward the value of the latter, i.e. the output voltage of the high gain amplifier depends on the difference between the replica voltage and the reference voltage. This then causes the tail transistor(s) to vary the current that can flow therethrough. This controlled current then drives the actual common mode voltage present on the output of the long tailed pair(s) toward the value of the reference voltage. In practice, this causes the voltage around which output signals are centred to shift higher or lower to the value of the reference voltage.

The invention claimed is:

1. A differential amplifier comprising:
   a long tailed pair transistor configuration comprising a differential pair of transistors and a tail transistor; and
   a replica circuit configured to vary a feedback current in the replica circuit to match a replica voltage to a reference voltage, wherein varying the feedback current in the replica circuit provides a bias voltage to the tail transistor in the long tailed pair which controls a tail current through the tail transistor to determine a common mode voltage in the long tailed pair;
   wherein:
   the replica circuit includes a feedback transistor arranged to replicate one of the differential pair of transistors;
   a gate of the feedback transistor is connected to a drain of the feedback transistor; and
   the replica circuit is scaled to use less current than the tail current through the tail transistor.

2. The differential amplifier as claimed in claim 1 configured as a fully differential amplifier.

3. The differential amplifier as claimed in claim 1 wherein the replica circuit controls the common mode voltage in the differential pair and at least one additional differential pair.

4. The differential amplifier as claimed in claim 1 wherein the feedback loop further comprises an amplifier.

5. The differential amplifier as claimed in claim 1 wherein at least one of the differential pair of transistors is connected to a power supply voltage via a resistor.

6. The differential amplifier as claimed in claim 1 wherein the replica circuit is scaled to use less than 50% of the long tailed pair current.

7. The differential amplifier as claimed in claim 1 comprising field effect transistors.

8. A battery powered integrated circuit comprising a differential amplifier, said differential amplifier comprising:
   a long tailed pair transistor configuration comprising a differential pair of transistors and a tail transistor; and
   a replica circuit configured to vary a feedback current in the replica circuit to match a replica voltage to a reference voltage, wherein varying the feedback current in the replica circuit provides a bias voltage to the tail transistor in the long tailed pair which controls a tail current through the tail transistor to determine a common mode voltage in the long tailed pair;
   wherein:
   the replica circuit includes a feedback transistor arranged to replicate one of the differential pair of transistors;
   a gate of the feedback transistor is connected to a drain of the feedback transistor; and
   the replica circuit is scaled to use less current than the tail current through the tail transistor.

9. The battery powered integrated circuit as claimed in claim 8 wherein the differential amplifier is configured as a fully differential amplifier.

10. The battery powered integrated circuit as claimed in claim 8 wherein the replica circuit controls the common mode voltage in the differential pair and at least one additional differential pair.

11. The battery powered integrated circuit as claimed in claim 8 wherein the feedback loop further comprises an amplifier.

12. The battery powered integrated circuit as claimed in claim 8 wherein at least one of the differential pair of transistors is connected to a power supply voltage via a resistor.

13. The battery powered integrated circuit as claimed in claim 8 wherein the replica circuit is scaled to use less than 50% of the long tailed pair current.

14. The battery powered integrated circuit as claimed in claim 8 comprising field effect transistors.

* * * * *